(12) United States Patent
Mori et al.

(10) Patent No.: US 8,299,606 B2
(45) Date of Patent: Oct. 30, 2012

(54) SEMICONDUCTOR DEVICE INCLUDES A CERAMIC SUBSTRATE AND HEAT SINK

(75) Inventors: Shogo Mori, Aichi-ken (JP); Eiji Kono, Aichi-ken (JP); Keiji Toh, Aichi-ken (JP)

(73) Assignee: Kabushiki Kaisha Toyota Jidoshokki, Aichi-Ken (JP)

( * ) Notice: Subject to any disclaimer, the term of this patent is extended or adjusted under 35 U.S.C. 154(b) by 0 days.

(21) Appl. No.: 13/361,446

(22) Filed: Jan. 30, 2012

(65) Prior Publication Data

US 2012/0126390 A1 May 24, 2012

Related U.S. Application Data

(62) Division of application No. 12/698,183, filed on Feb. 2, 2010.

(30) Foreign Application Priority Data

Feb. 4, 2009 (JP) .................................. 2009-024167

(51) Int. Cl.
*H01L 23/10* (2006.01)
*H01L 23/34* (2006.01)

(52) U.S. Cl. ........ 257/706; 257/707; 257/713; 257/717; 257/720

(58) Field of Classification Search .................. 257/675, 257/706, 707, 712, 713, 717, 720, E23.101, 257/E23.103
See application file for complete search history.

(56) References Cited

U.S. PATENT DOCUMENTS

| 3,728,783 | A | | 4/1973 | Chartet | |
|---|---|---|---|---|---|
| 5,956,576 | A | * | 9/1999 | Toy et al. | 438/125 |
| 5,990,552 | A | * | 11/1999 | Xie et al. | 257/718 |
| 6,014,314 | A | * | 1/2000 | Mikubo | 361/704 |
| 6,245,442 | B1 | * | 6/2001 | Towata et al. | 428/614 |
| 6,903,929 | B2 | * | 6/2005 | Prasher et al. | 361/699 |
| 7,002,247 | B2 | * | 2/2006 | Mok et al. | 257/713 |
| 7,038,313 | B2 | * | 5/2006 | Mochizuki et al. | 257/713 |
| 7,180,179 | B2 | * | 2/2007 | Mok et al. | 257/714 |
| 7,250,674 | B2 | * | 7/2007 | Inoue | 257/712 |

(Continued)

FOREIGN PATENT DOCUMENTS

CN 101218671 7/2008
(Continued)

OTHER PUBLICATIONS

"Chapter 2: Thermal Expansion", in: "Thermal Properties of Metals", Feb. 28, 2003, ASM International, XP002584504 ISBN: 0871707683, pp. 9-16.

*Primary Examiner* — Ngan Ngo
(74) *Attorney, Agent, or Firm* — Greenblum & Bernstein P.L.C.

(57) ABSTRACT

A semiconductor device is provided that may include an insulating substrate having a ceramic substrate and metal coating layers on opposite surfaces of the ceramic substrate, a semiconductor chip mounted on one surface of the insulating substrate, and a heat sink directly or indirectly fixed to the other surface of the insulating substrate and thermally connected to the semiconductor chip through the insulating substrate. The heat sink may include a housing that is made of a metal sheet and radiating fins that are fixed in the housing and made of aluminum. The metal sheet may have a coefficient of thermal expansion between those of the insulating substrate and the radiating fin.

1 Claim, 4 Drawing Sheets

U.S. PATENT DOCUMENTS

| | | | |
|---|---|---|---|
| 8,030,760 B2 * | 10/2011 | Toh et al. | 257/712 |
| 2003/0090873 A1 * | 5/2003 | Ohkouchi | 361/704 |
| 2005/0040515 A1 * | 2/2005 | Inoue et al. | 257/706 |
| 2007/0086168 A1 * | 4/2007 | Khanna et al. | 361/719 |
| 2008/0128896 A1 * | 6/2008 | Toh et al. | 257/712 |
| 2009/0200065 A1 | 8/2009 | Otoshi et al. | |
| 2010/0002399 A1 * | 1/2010 | Mori et al. | 361/719 |
| 2011/0241198 A1 * | 10/2011 | Azuma | 257/696 |
| 2012/0049341 A1 * | 3/2012 | Bezama et al. | 257/713 |
| 2012/0175765 A1 * | 7/2012 | Mori et al. | 257/706 |

FOREIGN PATENT DOCUMENTS

| | | |
|---|---|---|
| EP | 1901350 | 3/2008 |
| JP | 2000-332170 | 11/2000 |
| WO | 2008/075409 | 6/2008 |

* cited by examiner

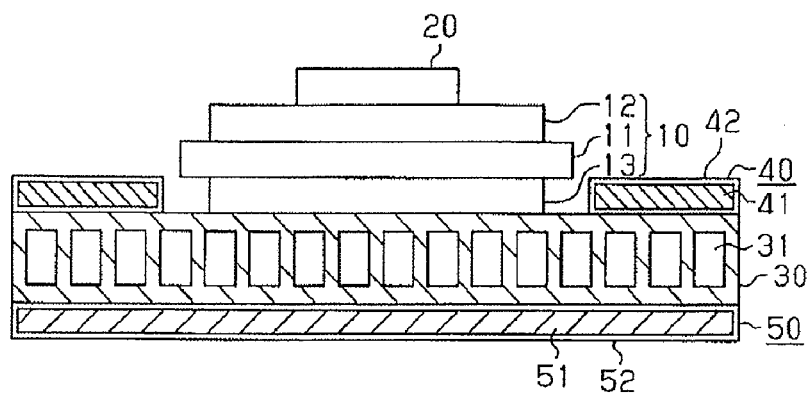
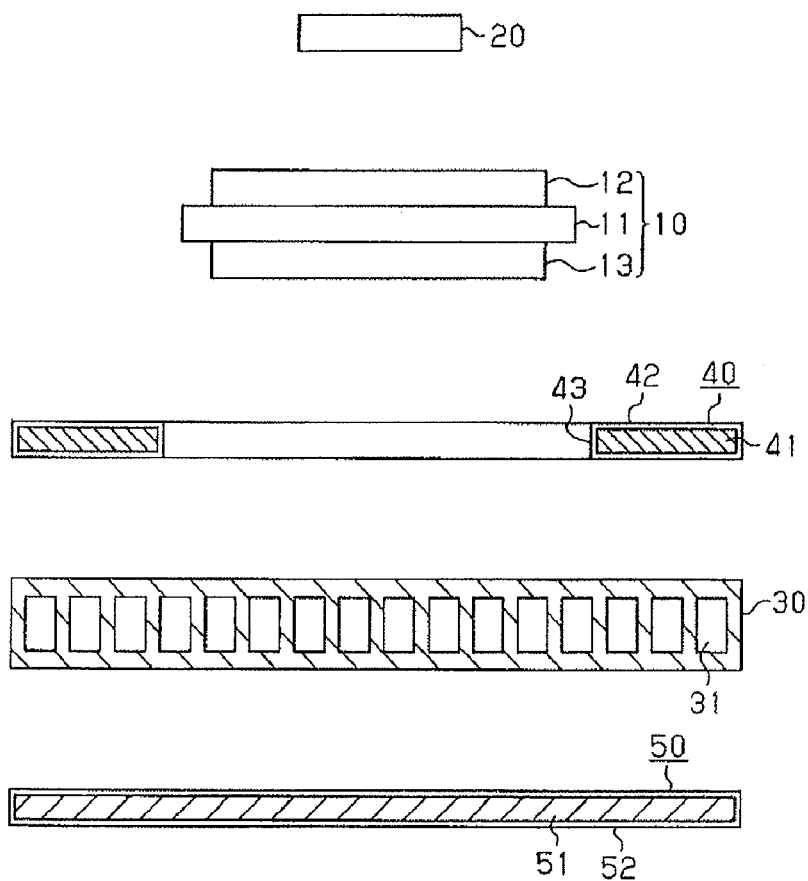

SEMICONDUCTOR DEVICE INCLUDES A CERAMIC SUBSTRATE AND HEAT SINK

CROSS-REFERENCE TO RELATED APPLICATION

This application is a divisional of application Ser. No. 12/698,183, filed Feb. 2, 2010, which claims priority to Japanese Application No. 2009-024167, filed Feb. 4, 2009. The disclosures of application Ser. No. 12/698,183 and Japanese Application 2009-024167 are incorporated by reference herein in their entireties.

BACKGROUND OF THE INVENTION

The present invention is related to a semiconductor device.

A semiconductor device has an insulating substrate with semiconductor chips mounted thereon and the insulating substrate is joined to the surface of a heat radiating plate. In such a semiconductor device, heat generated by the semiconductor chips is released to the heat radiating plate through the insulating substrate. However, the difference in coefficient of thermal expansion between the insulating substrate and the heat radiating plate may cause the heat radiating plate to be warped. Japanese Patent Application Publication 2000-332170 discloses a semiconductor device to solve the problem. The semiconductor device of the Publication has an insulating substrate with semiconductor chips mounted on one surface thereof and a copper plate joined to the other surface thereof by soldering.

The surface of the copper plate that is opposite from the insulating substrate is joined by soldering to an auxiliary sheet (e.g., a molybdenum sheet) having a coefficient of thermal expansion substantially equivalent to that of the insulating substrate. This structure keeps balance between different stresses generated on opposite surfaces of the copper plate due to the thermal change thereby to prevent the copper plate from being warped.

Though the molybdenum sheet as the auxiliary sheet may be joined to the copper plate as the heat sink by soldering, it is not easy to join these two different sheets by aluminum brazing. The joint made by the soldering is low in strength and reliability.

The present invention is directed to providing a reliable semiconductor device in which an anti-warping sheet can be joined to a heat sink easily by brazing for preventing the heat sink from being warped.

SUMMARY OF THE INVENTION

A semiconductor device includes an insulating substrate having a ceramic substrate and metal coating layers on opposite surfaces of the ceramic substrate, a semiconductor chip mounted on one surface of the insulating substrate, a heat sink directly or indirectly fixed to the other surface of the insulating substrate and thermally connected to the semiconductor chip through the insulating substrate and at least one anti-warping sheet disposed on at least one surface of the heat sink. The anti-warping sheet is made of a metal sheet having a coating layer and has coefficient of thermal expansion between those of the insulating substrate and the heat sink.

Other aspects and advantages of the invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention together with objects and advantages thereof, may best be understood by reference to the following description of the presently preferred embodiments together with the accompanying drawings in which:

FIG. 1 is a longitudinal sectional view of a semiconductor device according to a first embodiment of the present invention;

FIG. 2 is an exploded view of the semiconductor device of FIG. 1;

FIRST EMBODIMENT

Figure 3:
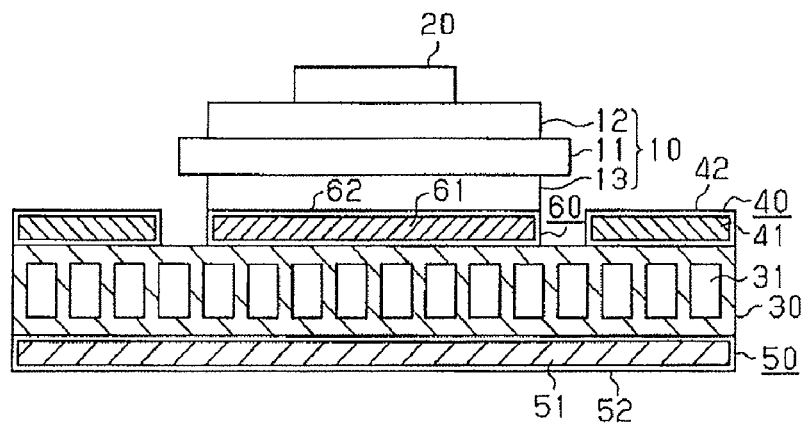
FIG. 3 is a longitudinal sectional view of a semiconductor device according to a second embodiment of the present invention.

The following will describe the first embodiment of the semiconductor device of the present invention with reference to FIGS. 1 and 2. In the embodiment the semiconductor device is embodied as a power module used in a vehicle.

As shown in FIG. 2, the power module as the semiconductor device has an insulating substrate 10, a semiconductor chip 20 and a heat sink 30. The semiconductor chip 20 is mounted on the top surface of the insulating substrate 10 and the heat sink 30 is fixed to the bottom surface of the insulating substrate 10.

The insulating substrate 10 includes an insulating ceramic substrate 11 and first and second metal coating layers 12, 13 formed on opposite surfaces of the ceramic substrate 11. Specifically, the first metal coating layer 12 is coated on one surface (e. g., top surface) of the ceramic substrate 11 where the semiconductor chip 20 is mounted and the second metal coating layer 13 is coated on the other surface (e. g., bottom surface) of the ceramic substrate 11. The ceramic substrate 11 is made of, e.g., aluminum nitride (AlN), alumina (Al2O3) and silicon nitride (Si3N4). The metal coating layers 12, 13 are made of aluminum.

Coefficient of thermal expansion of the ceramic substrate 11 is about 3-7 ppm/° C. Specifically, the ceramic substrate 11 made of aluminum nitride (AlN), alumina (Al2O3) or silicon nitride (Si3N4) has coefficient of thermal expansion of about 4 ppm/° C., 7 ppm/° C. or 3 ppm/° C., respectively. Thus, the thickness of the metal coating layers 12, 13 coated on opposite surfaces of the ceramic substrate 11 is small and the coefficient of thermal expansion of the insulating substrate 10 is about 3-7 ppm/° C.

The semiconductor chip 20 that generates heat is joined to the metal coating layer 12 at the top of the insulating substrate 10 by soldering. The semiconductor chip 20 is a combination of power devices such as an IGBT, a MOSFET and a diode. The semiconductor chip 20 generates heat while being driven.

The heat sink 30 is made of a metal having a high radiation efficiency, such as aluminum. The coefficient of thermal expansion of the aluminum heat sink 30 is about 24 ppm/° C.

The heat sink 30 has therein spaces extending parallel to each other thereby to provide a plurality of cooling passages 31 through which cooling water flows. The cooling passage 31 has an inlet and an outlet (neither being shown), both of which are formed so as to be communicable with a cooling water circulation channel of a vehicle.

The insulating substrate 10 is disposed in the center of the top surface of the heat sink 30 and the metal coating layer 13 of the insulating substrate 10 is joined to the heat sink 30 by aluminum brazing (The heat sink 30 is fixed to the surface of the insulating substrate 10 opposite from the surface thereof where the semiconductor chip 20 is joined). Therefore, the heat sink 30 is thermally connected to the semiconductor chip 20 through the insulating substrate 10 and the heat generated by the semiconductor chip 20 is conducted through the insulating substrate 10 to the heat sink 30 that serves as a radiator. The cooling capacity of the heat sink 30 is set so that the heat generated by the semiconductor chip 20 may be conducted to the heat sink 30 through the insulating substrate 10 and radiated efficiently from the heat sink 30.

A top sheet 40 is joined by aluminum brazing to the heat sink 30 around the substrate 10 for preventing the heat sink 30 from being warped. The top sheet 40 includes a steel sheet 41 and an aluminum coating layer 42 on the surface of the steel sheet 41. The aluminum coating layer is formed by aluminum plating. The steel sheet 41 as a metal sheet may be of a stainless steel. As shown in FIG. 2, the top sheet 40 has formed therethrough in the center thereof a hole 43 whose area as viewed from the top is slightly larger than that of the insulating substrate 10. Thus, the top sheet 40 is joined to the heat sink 30 by aluminum brazing on the same top surface of around the insulating substrate 10 where the insulating substrate 10 is also joined.

A bottom sheet 50 is joined by aluminum brazing to the entire bottom surface of the heat sink 30 for preventing the heat sink 30 from being warped. The bottom sheet 50 includes a steel sheet 51 as a metal sheet and an aluminum coating layer 52 on the surface of the steel sheet 51. The steel sheet 51 may be of a stainless steel. The bottom sheet 50 is joined by aluminum brazing to the bottom surface of the heat sink 30 that is opposite from the top surface of the heat sink 30 where the insulating substrate 10 is joined.

In the joining operation, the heat sink 30, the insulating substrate 10, the top sheet 40 and the bottom sheet 50 are brazed together simultaneously. To be more specific, referring to FIG. 2, the insulating substrate 10 and the top sheet 40 are disposed on the top surface of the heat sink 30 with aluminum brazing flux interposed therebetween and, at the same time, the bottom sheet 50 is disposed on the bottom surface of the heat sink 30 with aluminum brazing flux interposed therebetween. They are heated in a furnace so that the aluminum brazing flux may melt, and then they are placed under a room temperature so that they are brazed together. Subsequently, the semiconductor chip 20 is joined to the top surface of the insulating substrate 10 by soldering.

The linear coefficient of thermal expansion of the steel sheet is about 12 ppm/° C., and the coefficient of thermal expansion of the steel sheet 41 of the top sheet 40 and the steel sheet 51 of the bottom sheet 50 is between about 3-7 ppm/° C. of the insulating substrate 10 and about 24 ppm/° C. of the heat sink 30. The top sheet 40 and the bottom sheet 50, which are coated with aluminum on the surfaces thereof, have coefficient of thermal expansion of about 12 ppm/° C. that is substantially the same as that of the steel sheet.

Thus, the warping of the heat sink 30 which may occur when the temperature in the furnace is decreased during the brazing process can be prevented by the top sheet 40 and the bottom sheet 50. To describe more in details, if the coefficient of thermal expansion of the bottom sheet 50 is smaller than that of the insulating substrate 10, the heat sink 30 will not be warped into a convex shape, but into a concave shape. However, since the area of the bottom sheet 50 is larger than that of the insulating substrate 10 and the coefficient of thermal expansion of the top sheet 40 and the bottom sheet 50 is between the coefficients of thermal expansion of the insulating substrate 10 and the heat sink 30, the heat sink 30 is warped into a concave shape, but to a lesser extent.

Furthermore, since the insulating substrate 10 is directly joined to the heat sink 30 by brazing, the thermal resistance in heat radiating path between the insulating substrate 10 and the heat sink 30 can be minimized and the radiation efficiency can be improved, accordingly.

The following advantageous effects are obtained in the first embodiment.

(1) The bottom sheet 50 that is made of the steel sheet 51 having on the surface thereof an aluminum coating layer 52 and a coefficient of thermal expansion between those of the insulating substrate 10 and the heat sink 30, is joined to the bottom surface of the heat sink 30 by brazing. This structure prevents the heat sink 30 from being warped by heat and facilitates joining the anti-warping sheet to the heat sink 30 thereby to increase reliability of the semiconductor device.

(2) The top sheet 40 that is made of the steel sheet 41 having on the surface thereof an aluminum coating layer 42 and a coefficient of thermal expansion between those of the insulating substrate 10 and the heat sink 30, is joined to the top surface of the heat sink 30 around the insulating substrate 10 by brazing. This structure prevents the the heat sink 30 from being warped by heat and also facilitates joining the anti-warping sheet to the heat sink 30 thereby to increase reliability of the semiconductor device. Combination of the top and bottom sheets 40 and 50 can prevent the heat sink 30 from being warped by heat more effectively.

(3) The insulating substrate 10, the top sheet 40 and the bottom sheet 50 can be joined to the heat sink 30 simultaneously by brazing.

(4) The steel sheets 41, 51 as a metal sheet are made of an inexpensive steel and hence advantageous in terms of manufacturing cost.

(5) The heat sink 30 is made of aluminum that is inexpensive and hence advantageous in terms of manufacturing cost.

SECOND EMBODIMENT

The following will describe the second embodiment of the semiconductor device of the present invention.

Figure 4:
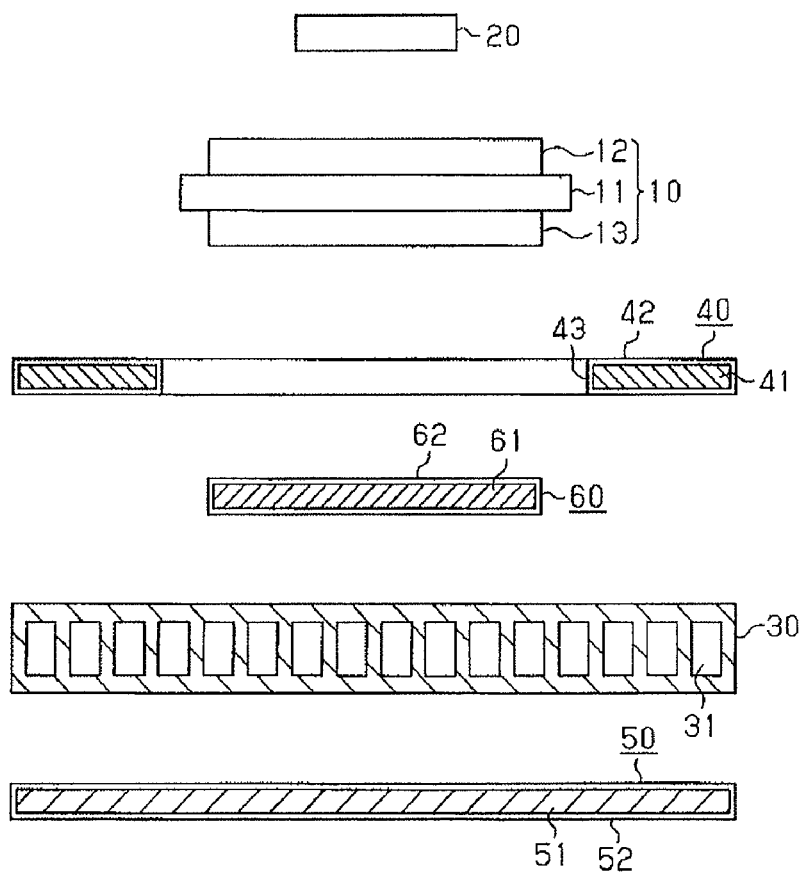
FIG. 4 is an exploded view of the semiconductor device of FIG. 3.

The second embodiment differs from the first embodiment (FIGS. 1 and 2) in that an anti-warping cushion sheet 60 is interposed between the insulating substrate 10 and the heat sink 30, as shown in FIGS. 3 and 4. The cushion sheet 60 includes a steel sheet 61 as a metal sheet and an aluminum coating layer 62 on the surface of the steel sheet 61. The steel sheet 61 may be of a stainless steel. As shown in FIG. 3, the cushion sheet 60 is joined to the insulating substrate 10 and the heat sink 30 by aluminum brazing.

The heat sink 30, the cushion sheet 60, the insulating substrate 10, the top sheet 40 and the bottom sheet 50 are brazed together simultaneously. Specifically, as shown in FIG. 4, the cushion sheet 60 and the top sheet 40 are disposed on the top surface of the heat sink 30 with aluminum brazing flux interposed therebetween and at the same time the insulating substrate 10 is disposed on the top surface of the cushion sheet 60 with aluminum brazing flux interposed therebetween, and furthermore, the bottom sheet 50 is disposed on the bottom surface of the heat sink 30 with aluminum brazing flux interposed therebetween. Then, they are exposed to a high temperature in a furnace so that the aluminum brazing flux melts. They are brazed together simultaneously by lowering the temperature in the furnace to a room temperature. Subsequently, the semiconductor chip 20 is joined to the top surface of the insulating substrate 10 by soldering.

Since the coefficient of thermal expansion of the steel sheet is about 12 ppm/° C., the coefficients of thermal expansion of the steel sheet 41 of the top sheet 40, the steel sheet 51 of the bottom sheet 50 and the steel sheet 61 of the cushion sheet 60 are all between about 3-7 ppm/° C. of the insulating substrate 10 and about 24 ppm/° C. of the heat sink 30. The cushion sheet 60 includes the steel sheet 61 and an aluminum coating layer 62 on the surface of the steel sheet 61, and the coefficient of thermal expansion of the cushion sheet 60 is about 12 ppm/° C. that is substantially the same as that of the steel sheet.

Thus, warping of the heat sink 30 which may occur when the temperature in the furnace is decreased during the brazing process can be prevented by this structure. To be more specific, thermal stress arises due to the difference in coefficient of thermal expansion between the heat sink 30 and the insulating substrate 10, but the cushion sheet 60 alleviates the thermal stress thereby to prevent the heat sink 30 from being warped. The insulating substrate 10 is joined by brazing to the heat sink 30 with the cushion sheet 60 interposed therebetween. Since the cushion sheet 60 is made of a steel sheet 61 coated with aluminum, the thermal resistance in heat radiating path between the insulating substrate 10 and the heat sink 30 can be minimized thereby to prevent the deterioration of the radiation efficiency.

The following advantageous effects are obtained in the second embodiment.
(1) The cushion sheet 60 that includes the steel sheet 61 having on the surface thereof an aluminum coating layer 62 and a coefficient of thermal expansion between those of the insulating substrate 10 and the heat sink 30, is interposed between the insulating substrate 10 and the heat sink 30 and joined to each of them by brazing. This structure prevents the heat sink 30 from being warped and facilitates joining the anti-warping sheet to the heat sink 30 thereby to increase reliability of the semiconductor device. The use of the cushion sheet 60 in addition to the top sheet 40 and the bottom sheet 50 can prevent the heat sink 30 from being warped more effectively than without the cushion sheet 60.
(2) The cushion sheet 60, the insulating substrate 10, the top sheet 40 and the bottom sheet 50 can be joined to the heat sink 30 simultaneously by brazing.
(3) The cushion sheet 60 is made of a steel that is inexpensive and hence advantageous in terms of manufacturing cost.

Figure 5:
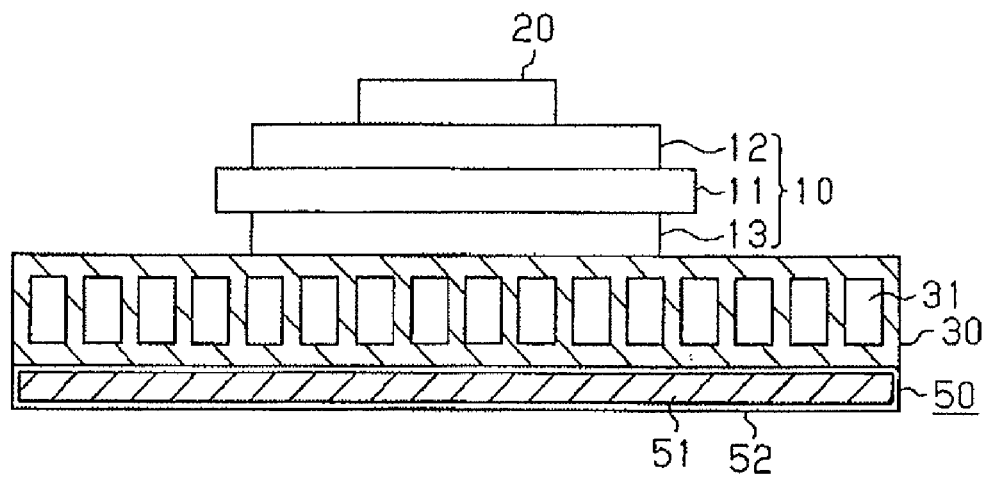
FIG. 5 is a longitudinal sectional view of a semiconductor device according to an alternative embodiment of the present invention.
Figure 6:
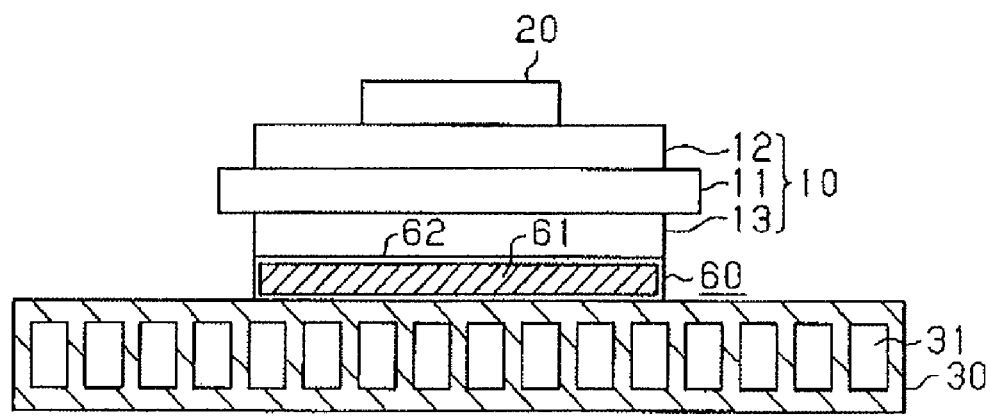
FIG. 6 is a longitudinal sectional view of a semiconductor device according to another alternative embodiment of the present invention.
Figure 7:
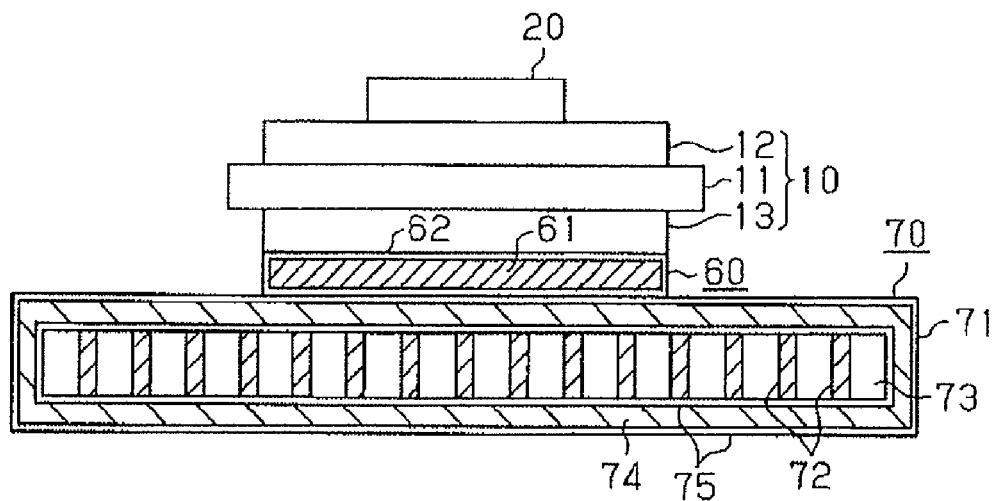
FIG. 7 is a longitudinal sectional view of a semiconductor device according to still another alternative embodiment of the present invention.
Figure 8:
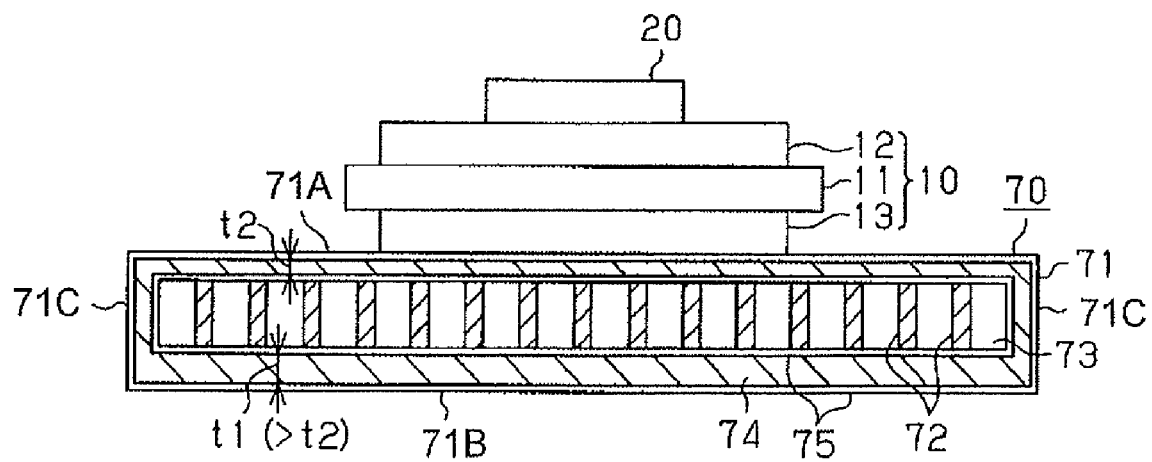
FIG. 8 is a longitudinal sectional view of a semiconductor device according to yet another alternative embodiment of the present invention.

The above embodiments can be modified in various ways as exemplified below.
  As shown in FIG. 5, the top sheet 40 of FIG. 1 may be dispensed with and only the bottom sheet 50 may be joined to the heat sink 30 by brazing.
  The cushion sheet 60 of FIGS. 3 and 4 may be replaced by a plate having formed therethrough many holes, such as a punching metal, and joined to the heat sink 30 and the substrate 10 by brazing.
  As shown in FIG. 6, the top sheet 40 and the bottom sheet 50 of FIGS. 3 and 4 may be dispensed with. In the embodiment of FIG. 6, heat produced by any part or element joined to the bottom surface of the heat sink 30 can be transferred to the heat sink 30 for cooling.
  The bottom sheet 50 of FIG. 3 may be dispensed with and only the top sheet 40 and the cushion sheet 60 may be joined to the heat sink 30 by brazing. When both the top sheet 40 and the cushion sheet 60 are joined to the heat sink 30 by brazing, warping of the heat sink 30 can be prevented more effectively than in the case in which only one of them is joined to the heat sink 30.
  The heat sink 30 as a radiator is formed so that water flows therethrough, but other cooling media such as alcohol may be used instead of water.
  The heat sink 30 is formed so that the cooling liquid flows therethrough, but it may be formed so as to radiate heat to the atmosphere (air-cooled). In this case, it may be forced-air-cooled or naturally-cooled without a fan.
  The top sheet 40, the bottom sheet 50 and the cushion sheet 60 are made of a steel sheet coated with aluminum, but a metal sheet other than a steel sheet is applicable and a coating layer other than an aluminum layer is also applicable. In other words, a metal sheet having on the surface thereof a coating layer and a coefficient of thermal expansion between those of the insulating substrate 10 and the heat sink 30 is usable.
  The heat sink 30 made of aluminum in the above embodiments may be made of other materials such as copper. The coefficient of thermal expansion of a heat sink made of copper is about 17 ppm/° C.
  FIG. 7 shows a heat sink of a different form. The heat sink 70 of FIG. 7 includes a box-shaped housing 71 having therein a space and radiating fins 72 made of aluminum. The aluminum radiating fins 72 are joined to the housing 71 inside thereof, dividing the space into a plurality of cooling passages 73. The housing 71 includes a steel sheet 74 as a metal sheet having on the surface thereof the aluminum coating layer 75 and a coefficient of thermal expansion between those of the insulating substrate 10 and the radiating fin 72. Except at least the radiating fins 72, the heat sink 70 is made of the same material as the anti-warping sheet or the cushion sheet 60 in FIG. 7. The steel sheet 74 may be of a stainless steel. The radiating fins 72 are joined to the housing 71 by brazing.
  Thus, the heat sink 70 may be made so as to have therein the radiating fins 72 and, with the exception of at least the radiating fin 72, may be made of a metal sheet having on the surface thereof the aluminum coating layer 75 and a coefficient of thermal expansion between those of the insulating substrate 10 and the radiating fin 72. In this case, a anti-warping sheet (e.g., the cushion sheet 60 shown in FIG. 7, the bottom sheet 50 and the top sheet 40 shown in FIG. 1) can be joined to the heat sink easily by brazing.
  The bottom sheet 50 may be formed with an area that is substantially the same as or larger than that of the insulating substrate 10.
  The metal coating layers 12, 13 of the insulating substrate 10 may be made of copper.
  The top sheet may be made of other materials than a metal sheet with a coating layer, such as a single material having a coefficient of thermal expansion between those of the insulating substrate 10 and the heat sink 30.
  FIG. 8 shows still another alternative embodiment which differs from the embodiment of FIG. 7 in that the cushion sheet 60 of FIG. 7 is dispensed with. The heat sink 70 shown in FIG. 8 is formed in the same manner as the heat sink 70 shown in FIG. 7. The heat sink 70 includes a box-shaped housing 71 having therein a space and radiating fins 72 made of aluminum. The aluminum radiating fins 72 are joined to the housing 71 inside thereof, dividing the space into a plurality of cooling passages 73. The housing 71 is made of the steel sheet 74 with an aluminum coating layer 75 and with a coefficient of thermal expansion between those of the insulating substrate 10 and the radiating fin 72. The box-shaped housing 71 has a top and a bottom surfaces 71A, 71B and four side surfaces 71C. The top surface 71A of the housing 71 is joined to the insulating substrate 10 by aluminum brazing and the thickness t1 of the steel sheet 74 forming the bottom surface 71 B of the housing 71 is larger than the thickness t2 of the steel sheet 74 forming the top surface 71A of the housing 71. Since the thickness t2 of the steel sheet 74 forming the top surface 71A of the housing 71 is small, the thermal resistance in heat radiating path for the semiconductor chip 20 between the insulating substrate 10 and the cooling passage 73 in the housing 71 can be minimized, thus offering good heat radiation efficiency. Also, since the thickness t1 of the steel sheet 74 forming the bottom surface 71 B of the housing 71 is large, warping of the heat sink 70 hardly arises. Thus, the semiconductor device has the insulating substrate 10 made of ceramic substrate 11 with the metal coating layers 12, 13 on both surfaces thereof. The semiconductor chip 20 joined by brazing to one surface of the insulating substrate 10 and the heat sink 70 is joined by brazing to the other surface of the insulating substrate 10, that is opposite from said one surface to which the semiconductor chip 20 is joined. The heat sink 70 is thermally connected to the semiconductor chip 20 through the insulating substrate 10. The heat sink 70 includes the housing 71 having therein the space and the radiating fin 72. The housing 71 is made of a metal sheet with an aluminum coating layer 75 and with a coefficient of thermal expansion between those of the insulating substrate 10 and the radiating fin 72. The top surface 71A of the housing 71 is joined to the insulating substrate 10 by aluminum brazing and the thickness t1 of the steel sheet 74 forming the bottom surface 71B of the housing 71 is larger than the thickness t2 of the steel sheet 74 forming the top surface 71A of the housing 71. This structure offers a good radiation efficiency, prevents warping of the heat sink 70 and facilitates joining the insulating substrate 10 to the heat sink 70 by brazing.

What is claimed is:

1. A semiconductor device comprising:
an insulating substrate having a ceramic substrate and metal coating layers on opposite surfaces of the ceramic substrate;
a semiconductor chip mounted on one surface of the insulating substrate; and
a heat sink directly or indirectly fixed to the other surface of the insulating substrate and thermally connected to the semiconductor chip through the insulating substrate,
wherein the heat sink includes:
a housing that is made of a metal sheet: and
radiating fins that are fixed in the housing and made of aluminum,
wherein the metal sheet has a coefficient of thermal expansion between those of the insulating substrate and the radiating fin.

* * * * *